United States Patent
McGrath

[11] Patent Number: 5,990,818
[45] Date of Patent: Nov. 23, 1999

[54] METHOD AND APPARATUS FOR PROCESSING SIGMA-DELTA MODULATED SIGNALS

[75] Inventor: David Stanley McGrath, Bondi, Australia

[73] Assignee: Lake DSP Pty Limited, New South Wales, Australia

[21] Appl. No.: 08/956,311

[22] Filed: Oct. 22, 1997

[30] Foreign Application Priority Data

Oct. 23, 1996 [AU] Australia ................................. PO3161

[51] Int. Cl.$^6$ .................................................. H03M 1/00
[52] U.S. Cl. ........................................................ 341/141
[58] Field of Search ................................ 341/139, 141, 341/143

[56] References Cited

U.S. PATENT DOCUMENTS

| | | | |
|---|---|---|---|
| 5,345,236 | 9/1994 | Sramek, Jr. | 341/144 |
| 5,627,536 | 5/1997 | Ramirez | 341/141 |
| 5,774,567 | 6/1998 | Heyl | 381/119 |
| 5,835,044 | 11/1998 | Nishino | 341/143 |

*Primary Examiner*—Michael Toker
*Assistant Examiner*—Anh Tran
*Attorney, Agent, or Firm*—Fulwider Patton Lee & Utecht, LLP

[57] ABSTRACT

A method of processing audio input signals comprising 1-bit, Sigma-Delta Modulated (SDM) signals is disclosed including the steps of combining the audio input signals to form a combined audio input signal; and utilising a Sigma-Delta Modulator to convert the combined audio input signal to a corresponding Sigma-Delta Modulated output signal. The method can include a linear mix of the audio input signals and each audio input signal can multiplied by a corresponding gain factor before being added together with other of the audio input signals. The Sigma-Delta Modulator can include a noise shaping filter designed to amplify components of the audio input signals below a predetermined threshold frequency and the combining step can include utilising a negative feedback of the combined audio input signal. The noise shaping filter can utilise a series of integrating circuits as a means to decrease the sensitivity of the filter to errors in its coefficients.

8 Claims, 5 Drawing Sheets

METHOD AND APPARATUS FOR PROCESSING SIGMA-DELTA MODULATED SIGNALS

FIELD OF THE INVENTION

The present invention relates to field of analogue to digital (A/D) conversion, signal processing in the digital domain and digital to analogue (D/A) conversion.

BACKGROUND OF THE INVENTION

A/D and D/A converters are well known in the art and differ in the quality and accuracy of conversion. Various factors influence the differences in quality, most especially, the sampling frequency and the number of bits of accuracy per sample. For a general discussion of real world problems experienced by A/D and D/A converters, reference is made to "Digital Signal Processing: principles, algorithms and applications", second edition by John Proakis and Dimitris Manolakis published 1992 by the Macmillan Publishing Company at pages 412–430.

A common form of A/D conversion is to utilise over sampling and pulse code modulation in a system known generally as sigma delta modulation (SDM). SDM methods are utilised in most modern digital audio systems. Referring now to FIG. 1, there is illustrated an example SDM system 1 which normally comprises two parts being a sigma delta modulator 2 and a decimator 3. The sigma delta modulator 2 normally converts an analogue input signal 4 into a 1-bit signal 5 having a high sample rate which can be, say, 64 times the final sample rate of the overall analogue to digital converter 1. The decimator 3 converts the 1-bit digital signal 5 to a digital audio signal 6 having the desired sample rate having multi-bit output. The decimator 3 normally comprises a low pass (anti-alias) filter of 1-bit signal 5.

The D/A conversion process utilising 1-bit techniques is similar to the A/D process. With reference to FIG. 2, the D/A process can normally comprise inputting a processed digital signal 7 which is interpolated and subjected to SDM sampling 11 to form a high frequency 1-bit signal 12 which is then converted to an analogue output and low pass filtered 13 to form a final analogue output 14.

For a general introduction as to the issues involved in the construction of SDM circuits and to the complexities of implementing SDM digital to analogue converters, reference is made to the standard text, "Delta-Sigma Data Converters", edited by S. R. Norsworthy et. al., published by IEEE Press Marketing, Piscataway, N.J.

It has been suggested by persons skilled in the field that digital audio systems utilising an arrangement of FIG. 1 and subsequent digital audio processing of signal 6, can produce inferior results due to the supposed destruction of much of the high frequency information in the original audio signal 4. There is growing body of evidence that frequencies normally considered outside the audible range (eg. above 20 kHz) play an important role in our perception of transient and other audio effects.

SUMMARY OF THE INVENTION

It is an object of the present invention to provide for an improved form of analogue to digital and digital to analogue processing which, as will become more apparent hereinafter, utilises 1-bit processing to provide improved results.

In accordance with the first aspect of the present invention there is provided a method of processing audio input signals comprising 1-bit, Sigma-Delta Modulated (SDM) signals, the method comprising:

combining the audio input signals to form a combined audio input signal; and utilising a Sigma-Delta Modulator to convert the combined audio input signal to a corresponding Sigma-Delta Modulated output signal.

Preferably, the combining step includes a linear mix of the audio input signals, with the linear mix including multiplying each audio input signal by a corresponding gain factor before adding the signals together.

Further, the sigma delta modulator preferably includes a noise shaping filter designed to amplify components of the audio input signals below a predetermined threshold frequency and the combining step includes utilising a negative feedback output from the Sigma-Delta modulator.

Preferably, the noise shaping filter includes a series of integrating circuits as a means to decrease the sensitivity of the filter to errors in its coefficients which are preferably merely binary fractions.

In accordance with another aspect of the present invention, there is disclosed an apparatus for implementation of the above methods.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF PREFERRED AND OTHER EMBODIMENTS

Figure 1:
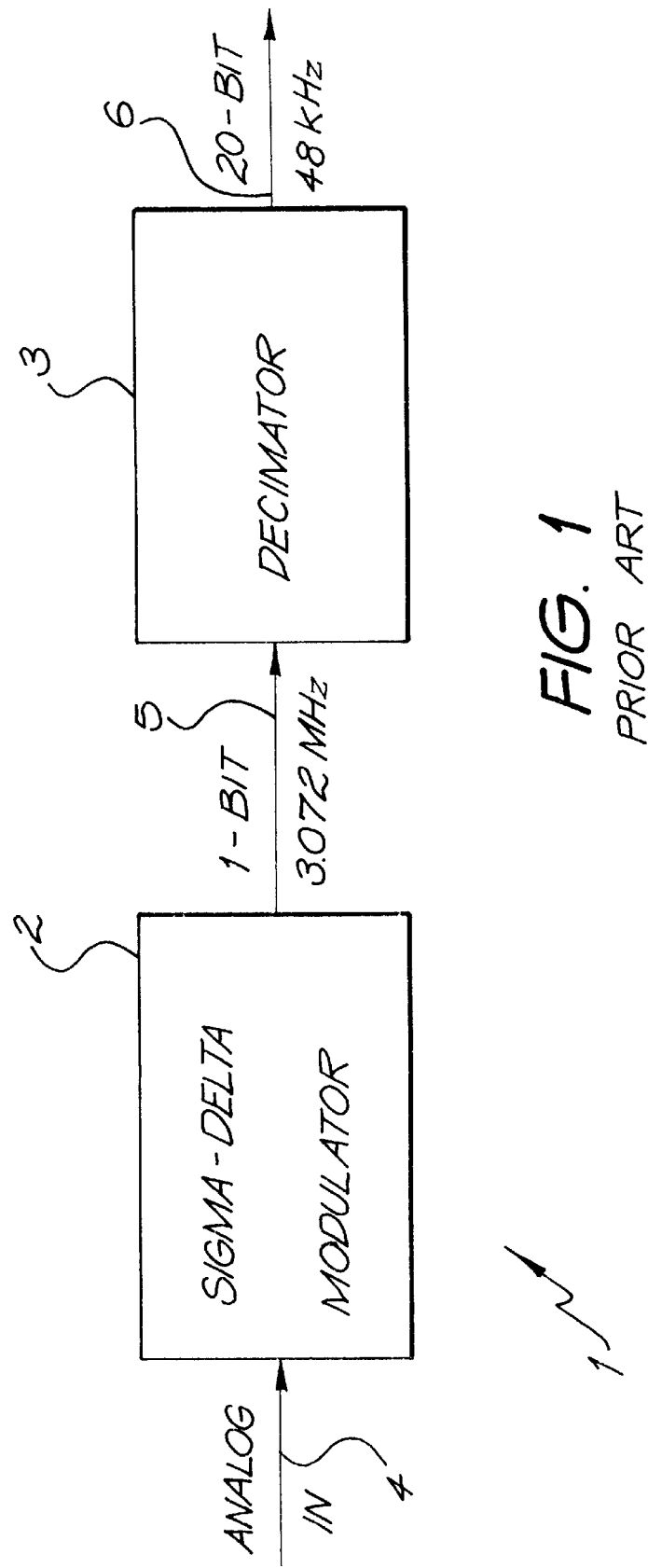
FIG. 1 illustrates a known form of A/D conversion.
Figure 2:
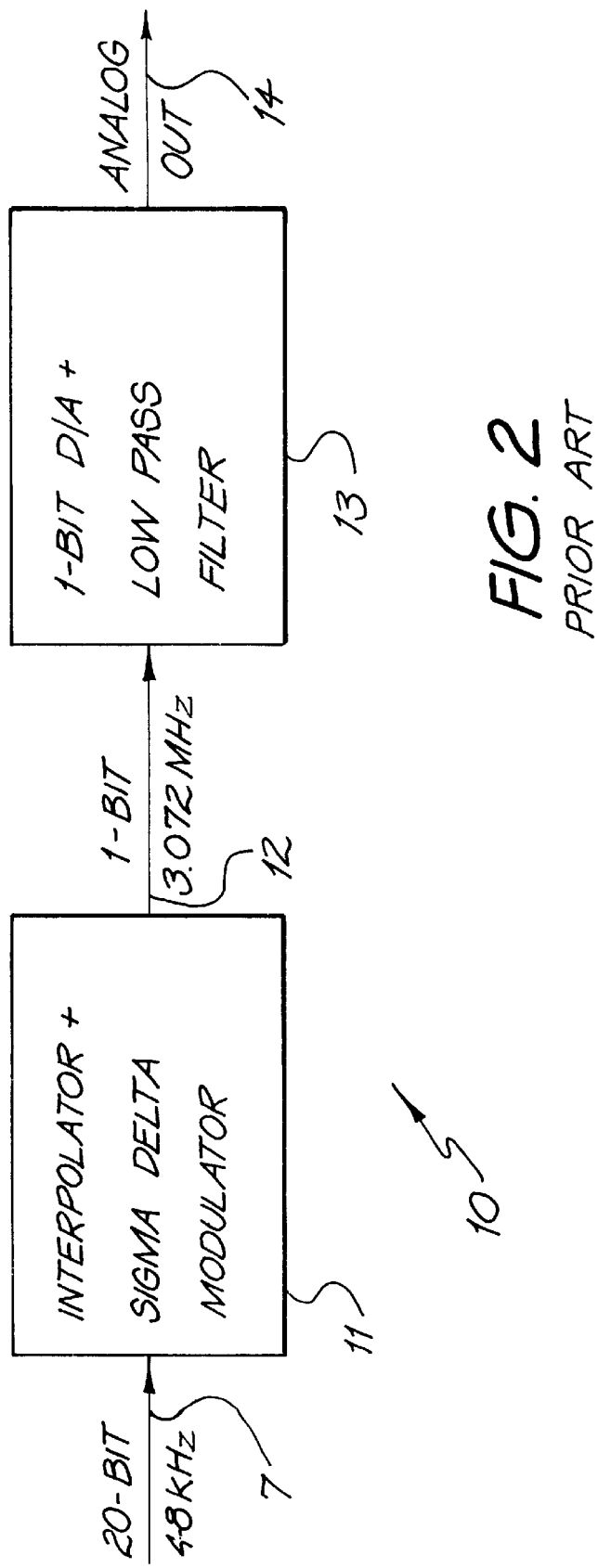
FIG. 2 illustrates a known form of D/A conversion.

In accordance with the preferred embodiment, the high frequency components of the A/D converter are preserved in that the decimator 3 of FIG. 1 is eliminated to avoid a loss in quality. As a result of investigations in formulating the preferred embodiment, it is believed that the choice of the standard 20-bit 48 kHz signal 6 is unsuitable as it dictates that anti-alias filters must be used. Hence, this is a limitation on the system with improvements in digital audio quality being limited to improving the anti-alias filtering process. By eliminating the decimator 3 of FIG. 1 improved audio quality can be obtained.

Figure 3:
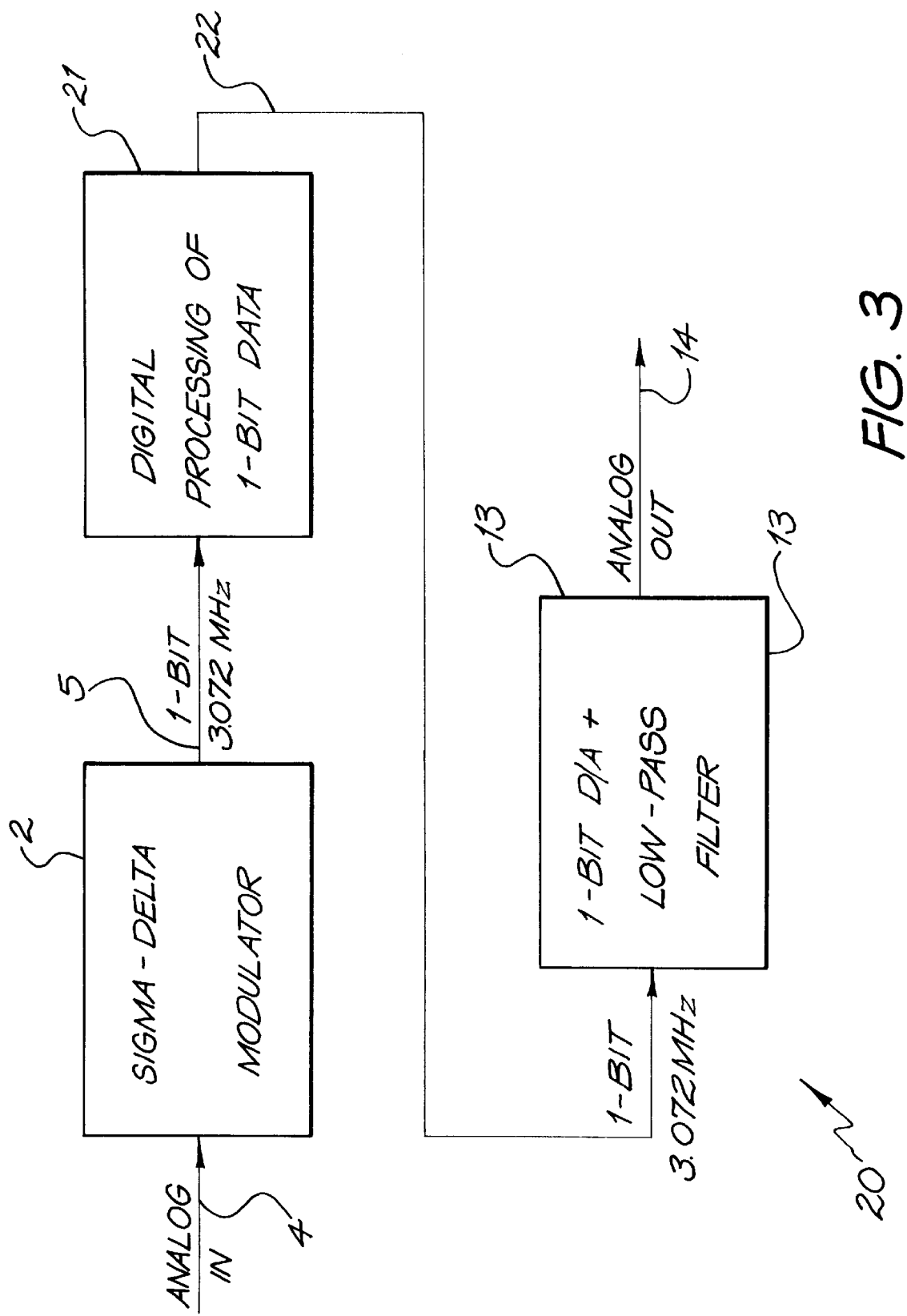
FIG. 3 illustrates the process of A/D and D/A conversion in accordance with the preferred embodiment.

Referring now to FIG. 3, there is illustrated the form of processing conducted by the preferred embodiment 20. In this embodiment, the analogue input signal 4 is subjected to SDM in the usual manner. The 1-bit output 5 is then subjected to digital processing 21 in the 1-bit domain. Subsequently, the 1-bit output signal 22, when desired to be output, is low pass filtered 13 in the usual manner. By eliminating the decimation process, the high frequency components are maintained and improved results produced. Of course, in some arrangements, the digital processing 21 can be dispensed with where no digital processing is necessary, such as in systems that are required to only delay the audio data, for example through a delay memory, or systems that are required to transmit audio data over a digital communication circuit.

Of course, a system constructed in accordance with FIG. 3 can include more than one input and/or more than one output, allowing multiple audio inputs to be combined and mixed in various ways in the digital processing of the 1-bit data 21.

Figure 4:
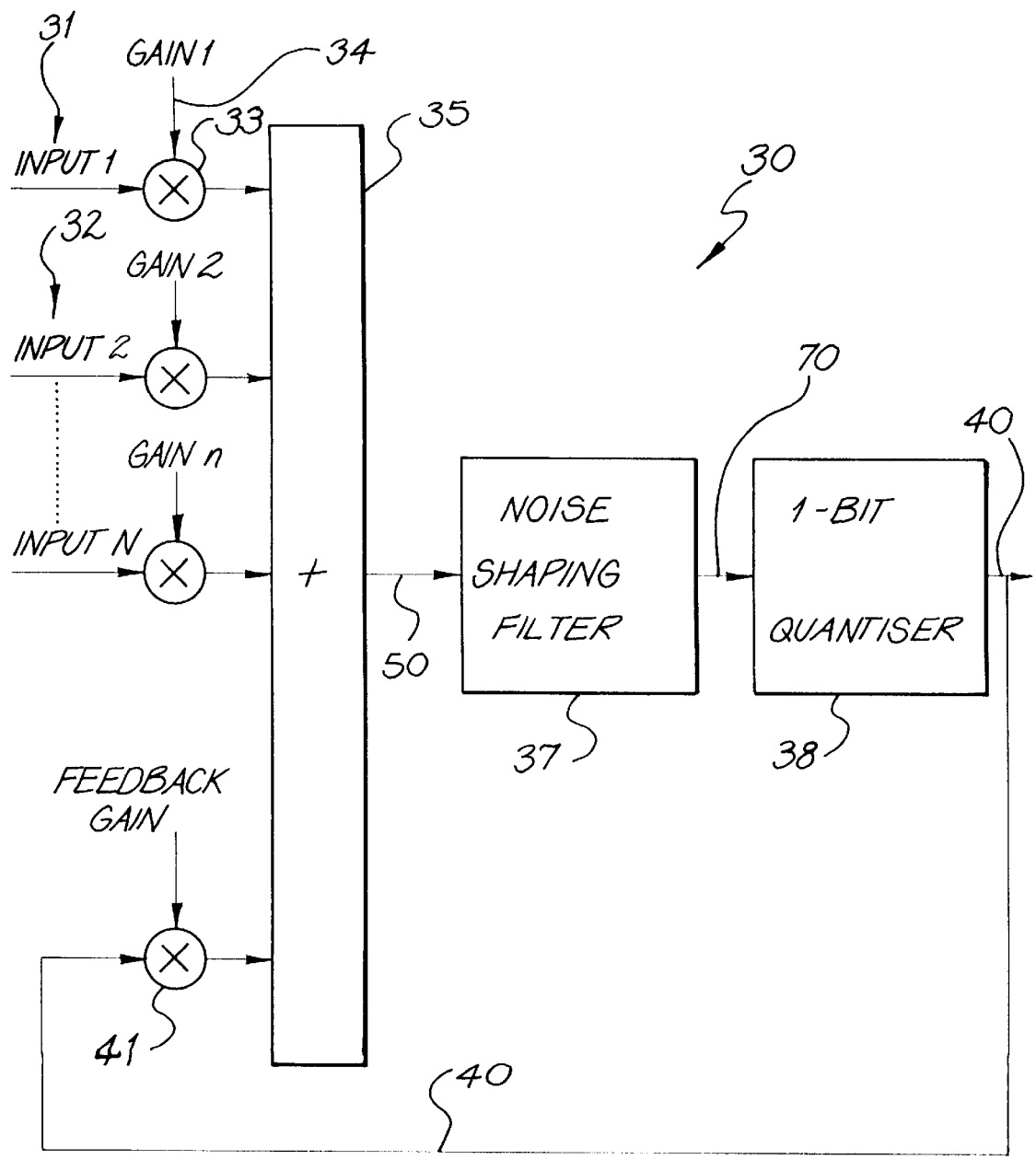
FIG. 4 illustrates a mixer constructed in accordance with the principles of the present invention.

Referring now to FIG. 4, there is illustrated one form of mixer suitable for mixing multiple 1-bit signals. The mixer 30 illustrates suitable circuit arrangements for simple processing of the 1-bit signals such as gain (multiplying the signal by a fixed coefficient) and addition of signals (summing together one or more signals). Although it may have been previously believed that such a process would be difficult because the signals produced would no longer be simple 1-bit signals, the arrangement 30 of FIG. 4 overcomes these problems providing a circuit for summing together a number of weighted 1-bit signals to produce a 1-bit signal at its output. Hence, the arrangement 30 of FIG. 4 can act as a building block in 1-bit processing systems.

In the arrangement 30, each input eg. 31, 32 is multiplied 33 by a corresponding gain 34 before being added together 35 to form a multi-bit output 50. The multi-bit output 50 of summer 35 is fed to a noise-shaping filter 37. Subsequently, the output of noise shaping filter 37 is fed to a one bit quantiser 38 which quantises its input signal to +1 or −1 depending on the sign of the output from noise shaping filter 37. The output 40 from the 1-bit quantiser 38 forms a final output corresponding to output 22 of FIG. 3. This output 40 is in a 1-bit form and is fed back to the circuit 30 via feedback gain multiplier 41 to also form a summation input fear summer 35. A typical value for the feedback gain is −1.

The output 40 of the arrangement of FIG. 4 will have the following characteristic at low frequencies:

$$output = \frac{\sum_{i=1}^{n} gain_i \times input_i}{-feedbackgain}$$

It should be further noted that in the arrangement 30, all the input signals and output signals are 1-bit signals. The other signals including the gain coefficient signals can be multi-bit signals. Hence, the gain multipliers eg. 33 take a 1-bit signal as input and their output is defined as follows:

$$Multiplier\ Output = \begin{cases} coef & if\ (InputSignal = +1) \\ -coef & if\ (InputSignal = -1) \end{cases}$$

Where coef is the coefficient or gain multiplier of the multiplier 33.

The number of bits utilised in the coefficients 34 and multiplier 33 will be determined based on the particular application. Typically, 16-bits in resolution will be suitable. The number of bits utilised within the noise shaping filer 37 will often be more than this. The noise shaping filter 37 must store its internal state with sufficient resolution to maintain a low noise level in the low frequency part of the outward signal. Hence, the internal state of the noise shaping filter 37 may require up to 24–32 bits for a high quality audio system.

Figure 5:
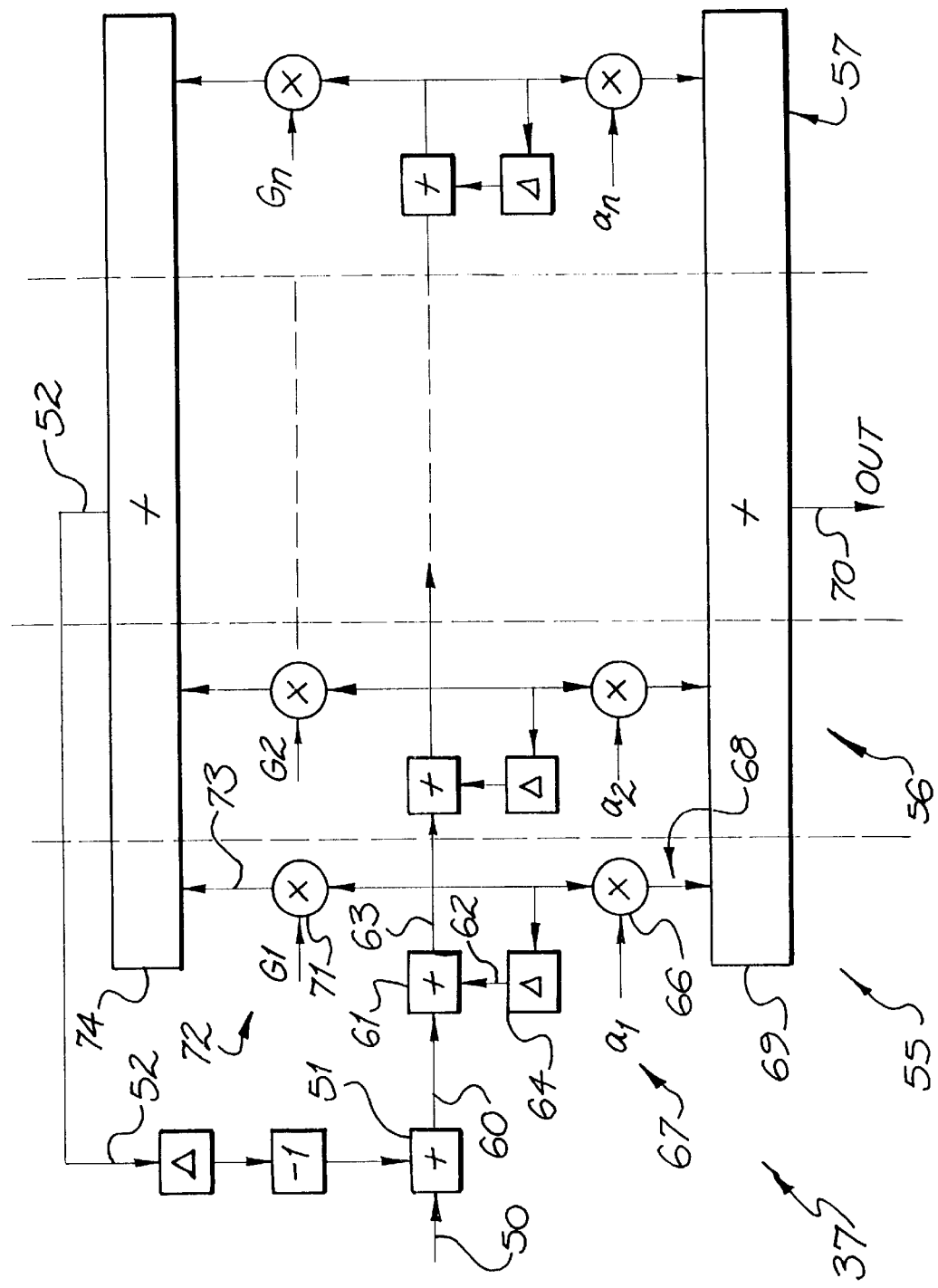
FIG. 5 illustrates a noise shaping filter of FIG. 4 in more detail.

Referring now to FIG. 5, there is illustrated one form of suitable arrangement of noise shaping filter 37. The noise shaping filter 37 is designed to provide a very high gain at frequencies below 20 kHz. In combination with the feedback loop of the mixer 30 of FIG. 4, this provides an output 40 which is very accurate in the range from DC to 20 kHz. As will become more apparent hereinafter, the noise shaping filter 37 is composed of a cascade arrangement of integrators, with each integrator stage feeding to feedback and feedforward gain components. The noise shaping filter is further provided to convert the multi-bit output signal 50 of summer 35 of FIG. 4 to a multi-bit output signal 70 for feeding to 1-bit quantiser 38.

The input signal 50 is initially subtracted 51 from a feedback output 52. The feedback output 52 being further described hereinafter. The filter 37 primarily comprises a number of stages eg. 55, 56 . . . 57. Each stage carries out a similar processing step and, in the preferred embodiment, seven stages are provided. Taking the first stage 55, the output 60 from summer 51 is added 61 with a feedback output 62 to form output 63. The output 63 is fed to delay element 64. The output 63 is also multiplied 66 by a filter coefficient 67 with the output 68 being forwarded to a summer 69. The summer 69 taking similar outputs to output 68 from each of the other stages eg. 55, 56 etc. to form a final output signal 70. The output 63 is also multiplied 71 by a second coefficient "1" 72 with the output 73 being forwarded to a second summer 74 with the corresponding outputs of other filter stages 55, 56 etc. The output 52 of summer 74 is then utilised as feedback signal for summer 51.

The filter coefficients of the arrangement 37 can be as follows:

a1=0.75000000000000
a2=0.31250000000000
a3=0.10937500000000
a4=0.02734375000000
a5=0.00488281250000
a6=0.00054931640625
a7=0.00003814697266
b1=0.00000000000000
b2=0.00244140625000
b3=0.00000166893005
b4=0.00000166893005
b5=0.0000000046202
b6=0.0000000023101
b7=0.00000000000000

The filter coefficients have been quantised to simple powers of 2 or the sum/difference of two powers of 2. This greatly simplifies the structure multipliers eg. 66, 71 of the noise shaping filter 37 as they can be readily built with simple shifter/add structures.

Referring again to FIG. 4, when the output of the 1-bit mixer 30 is compared to the desired ideal output, the noise can be measured as follows:

$$noise = MixerOuput - \frac{\sum_{i=1}^{n} gain_i \times input_i}{-feedbackgain}$$

this noise is the difference between the actual mixer output and the ideal output. The difference being mainly due to the fact that the actual output is constrained to contain only −1 and +1 signal values. Importantly, the 1-bit system described has noise mostly concentrated in frequencies above the 20 kHz limit or some other chosen threshold frequency. In the present case, the noise in the DC-20 kHz band is approximately 150 dB below the full scale. Hence, the arrangement 20 of FIG. 3 can operate with a noise performance better than conventional 24-bit Analogue to Digital processors.

The example of FIG. 4 can, of course, be utilised as a basic building block in the creation of more complex digital signal processing arrangements to provide for mixing and other original processing effects.

It would be appreciated by a person skilled in the art that numerous variations and/or modifications may be made to the present invention as shown in the specific embodiment without departing from the spirit or scope of the invention as broadly described. The present embodiment is, therefore, to be considered in all respects to be illustrative and not restrictive.

I claim:

1. A method of processing audio input signals comprising 1-bit, Sigma-Delta Modulated (SDM) signals, said method comprising:

combining a linear mix of said audio input signals to form a combined audio input signal; and utilising a Sigma-Delta Modulator to convert said combined audio input signal to a corresponding Sigma-Delta Modulated output signal.

2. A method of processing as claimed in claim 1 wherein each audio input signal is multiplied by a corresponding gain factor before being added together with corresponding other of said audio input signals.

3. A method of processing claimed in claim 1 wherein said Sigma-Delta Modulator includes a noise shaping filter designed to amplify components of said audio input signals below a predetermined threshold frequency and said combining step includes utilising a negative feedback of said combined audio input signal.

4. A method as claimed in claim 1 wherein said Sigma-Delta Modulator includes a noise shaping filter utilising a series of integrating circuits as a means to decrease the sensitivity of said filter to errors in its coefficients.

5. A method as claimed in claim 4 wherein said coefficients comprise binary fractions.

6. An audio signal processing apparatus for processing a series of audio signals, said apparatus comprising:

a series of linear mixers each applying an independent linear mix to a corresponding one of said series of audio signals to output a corresponding linear mix audio signal;

combining means combining said linear mix audio signals to output a combined mixed audio signal;

a sigma delta modulator sigma delta modulating said combined mixed audio signal to output a sigma delta modulated combined mixed audio signal.

7. An audio signal processing apparatus as claimed in claim 6 wherein:

said sigma delta modulated combined mixed audio signal is feedback to said combining means and combined with said linear mix audio signals to output said combined mixed audio signal.

8. An audio signal processing apparatus as claimed in claim 7 wherein said sigma delta modulator further comprises:

a noise shaping filter interconnected to said combined mixed audio signal, said noise shaping filter amplifying components of said combined mixed audio signal below a predetermined threshold frequency to output a filtered combined mixed audio signal; and a 1-bit quantizer quantizing said filtered combined mixed audio signal to output said sigma delta modulated combined mixed audio signal.

* * * * *

UNITED STATES PATENT AND TRADEMARK OFFICE
CERTIFICATE OF CORRECTION

PATENT NO. : 5,990,818

DATED : November 23, 1999

INVENTOR(S) : David Stanley McGrath

It is certified that error appears in the above-identified patent and that said Letters Patent is hereby corrected as shown below:

Column 3, line 30, delete "fear" and insert --for--; and

Column 4, line 20, delete "1" and insert --b1--.

Signed and Sealed this

Thirtieth Day of May, 2000

Attest:

Q. TODD DICKINSON

*Attesting Officer*      *Director of Patents and Trademarks*